US012813191B2

(12) United States Patent
Shirasaka et al.

(10) Patent No.: US 12,813,191 B2
(45) Date of Patent: Nov. 24, 2026

(54) METHOD FOR MANUFACTURING SEMICONDUCTOR DEVICE, CLEANING DEVICE, CLEANING METHOD, AND SEMICONDUCTOR DEVICE

(71) Applicant: Resonac Corporation, Tokyo (JP)

(72) Inventors: Toshiaki Shirasaka, Tokyo (JP); Tomoaki Shibata, Tokyo (JP); Shizu Fukuzumi, Tokyo (JP)

( * ) Notice: Subject to any disclaimer, the term of this patent is extended or adjusted under 35 U.S.C. 154(b) by 541 days.

(21) Appl. No.: 18/549,937

(22) PCT Filed: Mar. 24, 2022

(86) PCT No.: PCT/JP2022/014173
§ 371 (c)(1),
(2) Date: Sep. 11, 2023

(87) PCT Pub. No.: WO2022/203027
PCT Pub. Date: Sep. 29, 2022

(65) Prior Publication Data

US 2024/0321818 A1 Sep. 26, 2024

(30) Foreign Application Priority Data

Mar. 26, 2021 (WO) .................. PCT/JP2021/013034

(51) Int. Cl.
*H01L 23/48* (2006.01)
*H01L 23/52* (2006.01)
(Continued)

(52) U.S. Cl.
CPC ....... *H10P 72/0414* (2026.01); *H10W 80/016* (2026.01); *H10W 80/312* (2026.01); *H10W 80/327* (2026.01); *H10W 90/792* (2026.01)

(58) Field of Classification Search
CPC ... H01L 24/80; H01L 21/67051; H01L 24/08; H01L 2224/08145; H01L 2224/80011;
(Continued)

(56) References Cited

U.S. PATENT DOCUMENTS

2016/0126218 A1 5/2016 Kurita
2016/0190103 A1 6/2016 Kabe et al.
(Continued)

FOREIGN PATENT DOCUMENTS

CN 101590655 12/2009
JP S56-126938 10/1981
(Continued)

OTHER PUBLICATIONS

International Search Report dated Jun. 1, 2021 for PCT/JP2021/013034.
(Continued)

*Primary Examiner* — Niki H Nguyen
(74) *Attorney, Agent, or Firm* — SHIPWAY IP

(57) ABSTRACT

A method for manufacturing a semiconductor device includes preparing a first semiconductor substrate, preparing a second semiconductor substrate, polishing a second insulating film of the second semiconductor substrate, acquiring a plurality of semiconductor chips, each of which includes an insulating film portion corresponding to the second insulating film and a second electrode, by singulating the second semiconductor substrate, aligning the second electrode of a semiconductor chip with the first electrode of the first semiconductor substrate, bonding the first insulating film and the insulating film portion of the semiconductor chip to each other, and bonding the first electrode and the second electrode to each other. In the acquiring of the plurality of semiconductor chips, the second semiconductor substrate is singulated by dicing while cleaning the second
(Continued)

semiconductor substrate using a mixed cleaning fluid in which a gas is introduced into a cleaning liquid.

18 Claims, 9 Drawing Sheets

(51) Int. Cl.
*H01L 29/40* (2006.01)
*H10P 72/00* (2026.01)
*H10W 80/00* (2026.01)
*H10W 90/00* (2026.01)

(58) Field of Classification Search
CPC . H01L 2224/80895; H01L 2224/80896; H01L 21/2007; H01L 21/67092; H01L 21/6835; H01L 2221/6834; H01L 2221/68354; H01L 2221/68368; H01L 2221/68381; H01L 24/83; H01L 21/67253; H01L 21/7624; H01L 21/76251; H01L 22/12; H01L 21/02126; H01L 21/02263; H01L 21/0274; H01L 21/683; H01L 21/76254; H01L 21/78; H01L 2221/68313; H01L 2221/68327; H01L 2224/0362; H01L 2224/75305; H01L 2224/75315; H01L 2224/80201; H01L 2224/83001; H01L 2224/83203; H01L 2225/06593; H01L 24/03; H01L 24/27; H01L 24/75; H01L 24/89; H01L 24/94; H01L 24/95; H01L 2924/01014; H01L 2924/1032; H01L 2924/12041; H01L 2924/12042; H01L 2924/12043; H01L 2924/15738; H01L 21/02057; H01L 21/30625; H01L 21/561; H01L 21/568; H01L 21/76898; H01L 21/77; H01L 2224/83005; H01L 2224/83896; H01L 23/3185; H01L 24/29; H01L 24/96; H01L 24/97; H01L 25/50; H01L 2924/0002; H01L 2924/05442; H01L 21/02; H01L 21/02013; H01L 21/02076; H01L 21/30; H01L 21/67132; H01L 21/6836; H01L 24/05; H01L 2221/68318; H01L 2224/29188
See application file for complete search history.

(56) References Cited

U.S. PATENT DOCUMENTS

| | | | | |
|---|---|---|---|---|
| 2021/0028136 A1* | 1/2021 | Said | ................. | H10W 20/0234 |
| 2022/0139867 A1* | 5/2022 | Uzoh | .................... | H10W 90/00<br>438/107 |

FOREIGN PATENT DOCUMENTS

| | | | |
|---|---|---|---|
| JP | H8-125121 | 5/1996 | |
| JP | 2007-216377 | 8/2007 | |
| JP | 2009-285769 | 12/2009 | |
| JP | 2013-058623 | 3/2013 | |
| JP | 2015-139860 | 8/2015 | |
| JP | 2015-225868 | 12/2015 | |
| JP | 2016-092078 | 5/2016 | |
| JP | 2019-204818 | 11/2019 | |
| WO | 2008/004365 | 1/2008 | |
| WO | WO-2008004365 A1 * | 1/2008 | ........... B28D 5/0076 |
| WO | 2010/013728 | 2/2010 | |
| WO | 2015/040798 | 3/2015 | |

OTHER PUBLICATIONS

International Search Report dated Jun. 21, 2022 for PCT/JP2022/014173.
F.C. Chen et al., "System on Integrated Chips(SoIC TM) for 3D Heterogeneous Integration", 2019 IEEE 69th Electronic Components and Technology Conference (ECTC), 2019, p. 594-p. 599.
International Preliminary Report on Patentability with Written Opinion dated Oct. 5, 2023 for PCT/JP2021/013034.
International Preliminary Report on Patentability with Written Opinion dated Oct. 5, 2023 for PCT/JP2022/014173.

* cited by examiner

METHOD FOR MANUFACTURING SEMICONDUCTOR DEVICE, CLEANING DEVICE, CLEANING METHOD, AND SEMICONDUCTOR DEVICE

CROSS-REFERENCE TO RELATED APPLICATIONS

This application is a 35 U.S.C. § 371 national phase application of PCT/JP2022/014173, filed on Mar. 24, 2022, which claims priority to International Patent Application No. PCT/JP2021/013034, filed on Mar. 26, 2021.

TECHNICAL FIELD

The present disclosure relates to a method for manufacturing a semiconductor device, a cleaning device, a cleaning method, and a semiconductor device. More specifically, the present disclosure relates to a method for manufacturing a semiconductor device in which a semiconductor chip obtained by singulation is bonded to a semiconductor substrate (a semiconductor wafer, another semiconductor chip, or the like), a cleaning device used therefor, a cleaning method, and a semiconductor device manufactured by the manufacturing method.

BACKGROUND ART

In recent years, three-dimensional mounting has been studied in order to improve the degree of integration of LSIs. Non Patent Literature 1 discloses an example of three-dimensional mounting of semiconductor chips.

CITATION LIST

Non Patent Literature

Non Patent Literature 1: F. C. Chen et al., "System on Integrated Chips (SoIC™) for 3D Heterogeneous Integration", 2019 IEEE 69th Electronic Components and Technology Conference (ECTC), p. 594-599 (2019)

SUMMARY OF INVENTION

Technical Problem

In the case of performing such three-dimensional mounting of semiconductor chips, the use of hybrid bonding technology, which is used for wafer-to-wafer (W2W) bonding, has been studied for fine bonding of wiring between devices and prevention of misalignment during bonding. However, unlike W2W, when performing three-dimensional mounting of semiconductor chips, debris (cutting fragments), which is a foreign matter, may be generated in a process for singulation into semiconductor chips. This debris may adhere to the bonding interface (insulating film for hybrid bonding) of the semiconductor chip and the like. If bonding is performed in a state in which debris adheres to the bonding interface of the semiconductor chip and the like, connection failures occur in the manufactured semiconductor device.

It is an object of the present disclosure to provide a method for manufacturing a semiconductor device, a cleaning device, a cleaning method, and a semiconductor device capable of reducing connection failures of semiconductor chips when performing three-dimensional mounting of the semiconductor chips.

Solution to Problem

One aspect of the present disclosure relates to a method for manufacturing a semiconductor device. This method for manufacturing a semiconductor device includes preparing a first semiconductor substrate including a first substrate body and a first insulating film and a first electrode, the first insulating film and the first electrode being provided on a surface of the first substrate body; preparing a second semiconductor substrate including a second substrate body and a second insulating film and a plurality of second electrodes, the second insulating film and the plurality of second electrodes being provided on a surface of the second substrate body; polishing the second insulating film arranged on the surface side of the second semiconductor substrate; acquiring a plurality of semiconductor chips, each of which includes an insulating film portion corresponding to the second insulating film and at least one of the second electrodes, by singulating the second semiconductor substrate; aligning the second electrode of at least one of the plurality of semiconductor chips with the first electrode of the first semiconductor substrate; bonding the first insulating film of the first semiconductor substrate and the insulating film portion of the semiconductor chip to each other; and bonding the first electrode of the first semiconductor substrate and the second electrode of the semiconductor chip to each other. In the acquiring of the plurality of semiconductor chips, the second semiconductor substrate is singulated by dicing while cleaning the second semiconductor substrate using a mixed cleaning fluid in which a gas is introduced into a cleaning liquid.

In this manufacturing method, the second semiconductor substrate is singulated by dicing while cleaning the second semiconductor substrate using the mixed cleaning fluid in which the gas is introduced into the cleaning liquid, in the acquiring of the plurality of semiconductor chips. In this case, since the cleaning is performed by using the mixed cleaning fluid, which is mist-like by introducing the gas into the cleaning liquid, it is possible to increase the cleaning capability for fine debris while keeping the ejection pressure lower than that in the case of high-pressure cleaning. Therefore, it is possible to manufacture the semiconductor device by using the semiconductor chip in which debris generated by dicing has been reliably removed. As a result, it is possible to reduce connection failures of the semiconductor chips when performing three-dimensional mounting of the semiconductor chips.

In the manufacturing method described above, an adhesive strength of the second insulating film with respect to the second substrate body may be an adhesion strength at which a peeling rate in a cross-cut test is 1% or less. In this case, although the ejection pressure of the cleaning liquid is reduced, it is possible to suppress the occurrence of a situation in which the second insulating film itself or a part thereof scatters to become debris due to the impact caused by the cleaning when cleaning the second semiconductor substrate. Therefore, one of the causes of debris generation when performing singulation into the semiconductor chips, is suppressed, and then it is possible to further reduce connection failures of the semiconductor chips. The "peeling rate" is the ratio of the number of pieces peeled off to the total number of pieces in the cross-cut test. The "cross-cut test" is a cross-cut test of 100 squares (interval: 1 mm, 10×10=100 squares) defined in JIS K5400. Specifically, after making 11 notches in the target test piece at intervals of 1 mm, each of which reaches the base material in the vertical and horizontal directions, a cellophane adhesive tape is attached to the target test piece. Then, after one to two minutes have passed from the attachment of the cellophane adhesive tape, the cellophane adhesive tape is instantaneously peeled off while keeping the cellophane adhesive tape perpendicular to the adhesive surface, and the number of peeled pieces is counted. The peeling rate (%) is a value obtained by dividing the number of peeled pieces by the total number of pieces (100 pieces) and multiplying it by 100.

In the manufacturing method described above, the second insulating film may have a thickness of 20 μm or less. In this case, a thin semiconductor device can be manufactured by forming finer electrodes or circuits. For example, the minimum size (electrode width) of the second electrode formed within the second insulating film is defined by the thickness of the second insulating film and the aspect ratio of the photosensitive material used. When the aspect ratio of the photosensitive material is, for example, 1:1 (opening width: depth), the electrode width of the second electrode can be set to 20 μm or less by setting the thickness of the second insulating film to 20 μm or less. That is, according to this manufacturing method, the second electrode can be formed as a fine electrode.

In the manufacturing method described above, in the acquiring of the plurality of semiconductor chips, cleaning may be performed by ejecting the mixed cleaning fluid toward the second semiconductor substrate so that an ejection pressure of the mixed cleaning fluid is 10 $kgf/cm^2$ (0.980665 MPa) or less. In this case, it is possible to suppress the occurrence of a situation in which the semiconductor chips after dicing scatter (chip scattering) due to cleaning when dicing the second semiconductor substrate. In addition, it is possible to suppress the occurrence of a situation in which the second insulating film is peeled off from the second semiconductor substrate by the mixed cleaning fluid. Further, it is possible to suppress the occurrence of a situation in which the insulating film of the second semiconductor substrate is scattered by the mixed cleaning fluid to generate the debris. On the other hand, cleaning may be performed by ejecting the mixed cleaning fluid toward the second semiconductor substrate so that the ejection pressure of the mixed cleaning fluid is 2 $kgf/cm^2$ (0.196133 MPa) or more. In this case, debris can be effectively removed by cleaning when dicing the second semiconductor substrate. As described above, it is possible to improve the manufacturing yield of semiconductor devices. In this manner, it is possible to further reduce connection failures of the semiconductor chips.

In the manufacturing method described above, in the acquiring of the plurality of semiconductor chips, mist after cleaning of the mixed cleaning fluid ejected onto the second semiconductor substrate may be collected. In this case, since the mixed cleaning fluid containing debris after cleaning is quickly moved away from the cleaned semiconductor chips after dicing, it is possible to suppress the attachment of debris to the semiconductor chips. As a result, it is possible to further reduce connection failures of semiconductor chips when performing three-dimensional mounting of semiconductor chips.

In the manufacturing method described above, in the acquiring of the plurality of semiconductor chips, the mixed cleaning fluid may be ejected onto the second insulating film of the second semiconductor substrate, and dicing may be performed from the second insulating film toward the second substrate body. In this case, the bonding surface of the second semiconductor substrate for bonding to the first semiconductor substrate is exposed on the surface side. Therefore, after dicing, plasma, an ion beam, ultraviolet rays, or an electron beam can be easily applied to the surface of the second insulating film for surface treatment, or surface treatment can be easily performed by applying a coupling agent or the like to the surface of the second insulating film.

In the manufacturing method described above, the second insulating film of the second semiconductor substrate may contain an inorganic material. In this case, it is possible to manufacture a semiconductor device with a finer structure. In addition, since it is easy to strengthen the bonding between inorganic materials, the bonding strength between the semiconductor substrates can increase. Therefore, it is possible to improve the connection reliability of the semiconductor device.

In the manufacturing method described above, the second insulating film of the second semiconductor substrate may contain an organic material. In this case, due to the organic material that is a relatively soft material, debris that could not be removed by the cleaning is absorbed (embedded) in the insulating film portion formed of the organic material. Therefore, it is possible to further reduce connection failures of the semiconductor chips. That is, according to this manufacturing method, large debris that is difficult to embed in the insulating film portion is removed by cleaning the second semiconductor substrate using the mixed cleaning fluid, and fine debris that could not be removed by cleaning using the mixed cleaning fluid is embedded in the insulating film formed of an organic material to become harmless. Therefore, debris of different sizes can be removed or become harmless by two complementary means. Further, when the second insulating film is formed of an organic material, the thickness of the second insulating film may be 4 μm or more. In this case, since fine debris can be embedded in the insulating film formed of resin, which is an organic material, it is possible to make a good connection between the first insulating film and the insulating film portion of the semiconductor chip. The size of debris that can be embedded is defined by the thickness of the resin insulating film. For example, when the thickness of the second insulating film is 4 μm, debris with a diameter of 4 μm can be embedded in the second insulating film. That is, according to this manufacturing method, even if there is debris smaller than the thickness of the second insulating film, the debris is embedded in the resin insulating film. Therefore, it is possible to make a good connection between the first insulating film and the insulating film portion of the semiconductor chip.

When the second insulating film contains an organic material, the organic material contained in the second insulating film may contain polyimide, a polyimide precursor, polyamideimide, benzocyclobutene (BCB), polybenzoxazole (PBO), or a PBO precursor. Since these materials are liquid or soluble in a solvent, the second insulating film can be easily manufactured by, for example, spin coating. Therefore, a thin film can be easily formed. In addition, since these materials have high heat resistance, these materials can withstand high temperatures and the like when bonding the first semiconductor substrate and the second semiconductor substrate to each other. Therefore, bonding between the substrates can be performed more reliably.

One aspect of the present disclosure relates to a cleaning device used in any of the methods for manufacturing a semiconductor device described above. This cleaning device includes a first introduction unit configured to introduce the cleaning liquid, a second introduction unit configured to introduce the gas, a mixing unit configured to mix the gas with the cleaning liquid to form the mixed cleaning fluid, and a nozzle that ejects the mixed cleaning fluid. By using such a cleaning device, it is possible to more reliably remove debris on the bonding surfaces of the semiconductor chips after dicing.

The cleaning device described above may further include a mist collector that collects mist after cleaning of the mixed cleaning fluid ejected through the nozzle. In this case, due to the mist collector, the mixed cleaning fluid containing debris after cleaning is quickly moved away from the cleaned semiconductor chips after dicing. Therefore, it is possible to suppress the attachment of debris to the semiconductor chips. As a result, it is possible to further reduce connection failures of semiconductor chips when performing three-dimensional mounting of semiconductor chips.

Another aspect of the present disclosure relates to a cleaning method. This cleaning method includes preparing a semiconductor substrate including a substrate body and an insulating film and a plurality of electrodes, the insulating film and the plurality of electrodes being provided on a surface of the substrate body, and cleaning when singulating the semiconductor substrate. In the cleaning, the semiconductor substrate is singulated by dicing while cleaning the semiconductor substrate using the mixed cleaning fluid in which the gas is introduced into the cleaning liquid. In this case, since the cleaning is performed by using the mixed cleaning fluid, which is mist-like by introducing the gas into the cleaning liquid, it is possible to increase the cleaning capability for fine debris while keeping the ejection pressure lower than that in the case of high-pressure cleaning. Therefore, it is possible to manufacture the semiconductor device by using the semiconductor chip in which debris generated by dicing has been reliably removed. As a result, it is possible to reduce connection failures of the semiconductor chips when performing three-dimensional mounting of the semiconductor chips.

In the cleaning method described above, in the cleaning, cleaning may be performed by ejecting the mixed cleaning fluid toward the semiconductor substrate so that an ejection pressure of the mixed cleaning fluid is from 2 kgf/cm$^2$ (0.196133 MPa) to 10 kgf/cm$^2$ (0.980665 MPa). The insulating film of the semiconductor substrate to be cleaned may contain an organic insulating material. The insulating film may have a thickness of 4 μm or more. According to this cleaning method, since the ejection pressure is within a predetermined range, the insulating film is not peeled off by high-pressure cleaning. Therefore, large debris is removed by cleaning the semiconductor substrate using the mixed cleaning fluid, and fine debris (for example, debris with a diameter or width of 4 μm or less) that cannot be removed by cleaning using the mixed cleaning fluid can be embedded in the insulating film formed of an organic material to become harmless. As a result, it is possible to effectively reduce connection failures when connecting the singulated semiconductor substrate to another semiconductor substrate.

Another aspect of the present disclosure relates to a semiconductor device. This semiconductor device includes a first semiconductor substrate including a first substrate body and a first insulating film and a first electrode, the first insulating film and the first electrode being provided on a surface of the first substrate body, and a second semiconductor substrate including a second substrate body and a second insulating film and a second electrode, the second insulating film and the second electrode being provided on a surface of the second substrate body. The first electrode of the first semiconductor substrate and the second electrode of the second semiconductor substrate are bonded to each other, and the first insulating film of the first semiconductor substrate and the second insulating film of the second semiconductor substrate are bonded to each other. There is no more than one piece of debris of 50 μm or more within a range of 15 mm in length and 15 mm in width on the second insulating film.

In the semiconductor device described above, the number of pieces of debris of 50 μm or more on the second insulating film is suppressed to one or less in the range of 15 mm in length and 15 mm in width. In this case, in this semiconductor device, it is possible to reduce connection failures of the semiconductor chips.

Advantageous Effects of Invention

According to the present disclosure, it is possible to reduce connection failures of semiconductor chips when performing three-dimensional mounting of the semiconductor chips.

BRIEF DESCRIPTION OF DRAWINGS

FIG. 7A shows the bonding surface of a semiconductor chip cleaned by using a normal cleaning method (Comparative Example 1) and FIG. 7B shows the bonding surface of a semiconductor chip cleaned by using a two-fluid cleaning method (Example 1).

DESCRIPTION OF EMBODIMENTS

Figure 1:
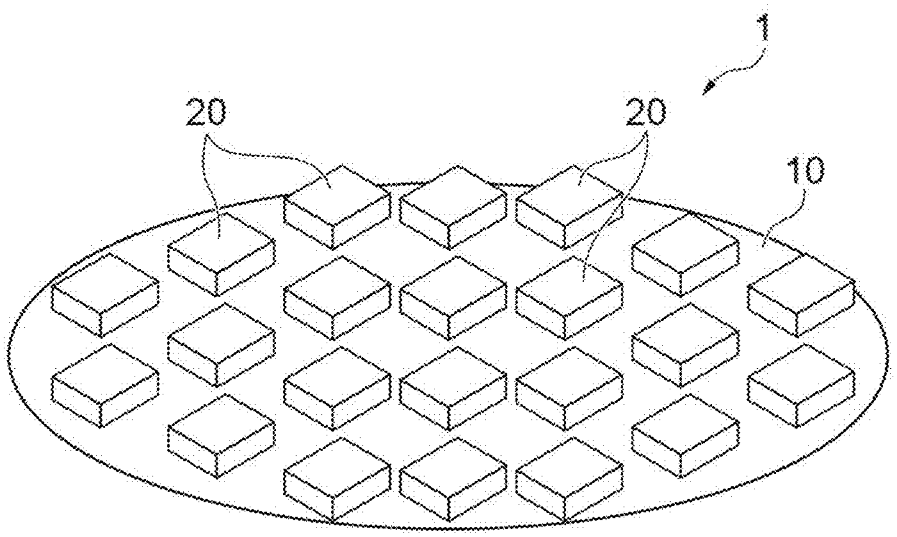
FIG. 1 is a cross-sectional view schematically showing an example of a semiconductor device (C2 W) manufactured by using a semiconductor device manufacturing method according to an embodiment of the present invention.

Hereinafter, several embodiments of the present disclosure will be described in detail with reference to the diagrams as necessary. In the following description, the same or equivalent portions are denoted by the same reference numerals, and repeated descriptions thereof will be omitted. It is assumed that the positional relationship such as up, down, left, and right is based on the positional relationship shown in the diagrams unless otherwise specified. When terms such as “left”, “right”, “front”, “rear”, “top”, “bottom”, “upper”, and “lower” are used in the description and claims of this specification, these are intended to be illustrative and do not necessarily mean that these are in the relative position at all times. The dimensional ratio of each diagram is not limited to the ratio shown in the diagram.

In this specification, the term “layer” includes not only a structure having a shape formed on the entire surface but also a structure having a shape partially formed when observed as a plan view. In this specification, the term “step” includes not only an independent step but also a step whose intended action is achieved even if the step cannot be clearly distinguished from other steps. The numerical range indicated by using “to” indicates a range including the numerical values before and after “to” as the minimum and maximum values, respectively.

(Configuration of Semiconductor Device)

FIG. 1 is a cross-sectional view schematically showing an example of a semiconductor device manufactured by using a manufacturing method according to the present embodiment. As shown in FIG. 1, a semiconductor device 1 is an example of a semiconductor package, for example. The semiconductor device 1 includes a first semiconductor substrate 10 and a plurality of semiconductor chips 20, and has a chip-to-wafer (C2W) structure. The plurality of semiconductor chips 20 are manufactured by singulating a second semiconductor substrate 200, which will be described later, by dicing. The plurality of semiconductor chips 20 are mounted on the first semiconductor substrate 10 to form a three-dimensional mounting structure. The first semiconductor substrate 10 may be a substrate on which a plurality of semiconductor chips such as Large Scale Integrated Circuit (LSI) chips or Complementary Metal Oxide Semiconductor (CMOS) sensors are formed at locations corresponding to the respective semiconductor chips 20, for example. Each semiconductor chip 20 may be a semiconductor chip such as an LSI or a memory, for example. In the first semiconductor substrate 10 and the plurality of semiconductor chips 20, each terminal electrode and the insulating film therearound are finely bonded strongly and without misalignment by hybrid bonding, which will be described later. The semiconductor device 1 may be further singulated into individual semiconductor devices each including one semiconductor chip 20, which is obtained by further singulation from the configuration shown in FIG. 1, and a substrate portion that is a part of the first semiconductor substrate 10 corresponding to one semiconductor chip 20.

(Method for Manufacturing Semiconductor Device)

Figure 2A:
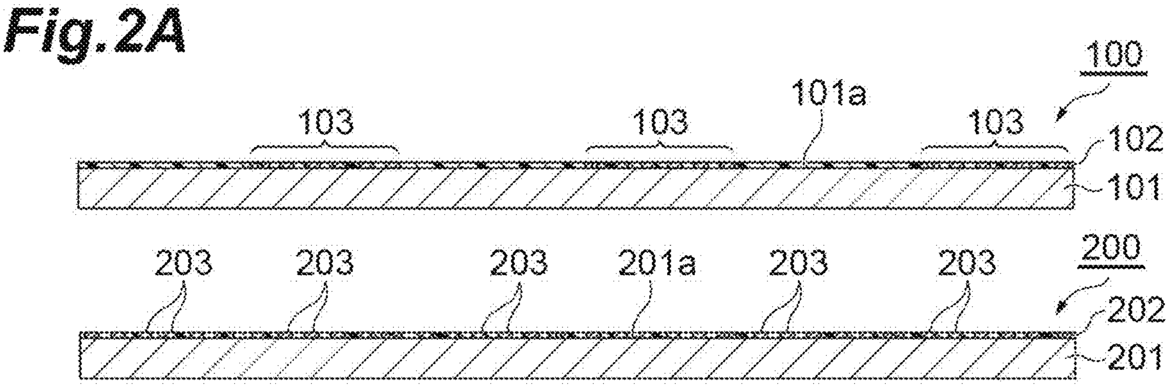
FIGS. 2A to 2D are diagrams sequentially showing a method for manufacturing the semiconductor device shown in FIG. 1.
Figure 2B:
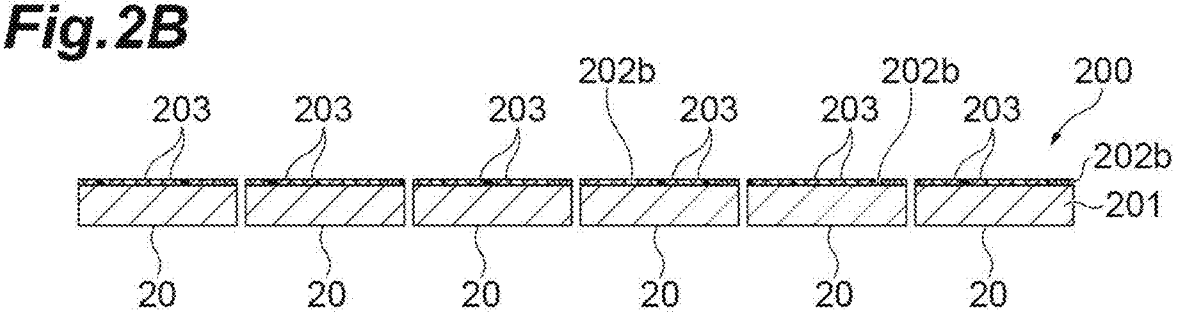

Next, a method for manufacturing the semiconductor device 1 will be described with reference to FIGS. 2A to 2D and FIG. 3. FIGS. 2A to 2D are diagrams sequentially showing a method for manufacturing the semiconductor device shown in FIG. 1. FIG. 3 is a diagram schematically showing the state of dicing and cleaning in the semiconductor device manufacturing method shown in FIGS. 2A to 2D.

The semiconductor device 1 can be manufactured, for example, through the following steps (a) to (h).

(a) A step of preparing a first semiconductor substrate 100 having a first substrate body 101, a first insulating film 102, and a plurality of first electrodes 103.

(b) A step of preparing the second semiconductor substrate 200 that is a semiconductor substrate corresponding to a plurality of semiconductor chips 20 and has a second substrate body 201, a second insulating film 202, and a plurality of second electrodes 203.

(c) A step of polishing the first insulating film 102 of the first semiconductor substrate 100 together with the first electrodes 103.

(d) A step of polishing the second insulating film 202 of the second semiconductor substrate 200 together with the second electrodes 203.

(e) A step of singulating the second semiconductor substrate 200 to obtain a plurality of semiconductor chips 20 each including an insulating film portion 202*b* corresponding to the second insulating film 202 and the second electrode 203.

(f) A step of aligning the second electrode 203 of each of the plurality of semiconductor chips 20 with the first electrode 103 of the first semiconductor substrate 100.

(g) A step of bonding the first insulating film 102 of the first semiconductor substrate 100 and the insulating film portions 202*b* of the plurality of semiconductor chips 20 to each other.

(h) A step of bonding the first electrode 103 of the first semiconductor substrate 100 and the second electrode 203 of each of the plurality of semiconductor chips 20.

[Steps (a) and (b)]

Step (a) is a step of preparing the first semiconductor substrate 100, which is a silicon substrate on which integrated circuits including semiconductor elements and wirings for connecting these are formed. In step (a), as shown in FIG. 2A, a plurality of first electrodes 103 formed of copper, aluminum, or the like are provided at predetermined intervals on a surface 101*a* of the first substrate body 101 formed of silicon or the like, and the first insulating film 102 formed of an inorganic material or an organic material is provided on the surface 101*a*. The first electrode 103 is an end surface electrode for exposing an integrated circuit and the like formed on the first semiconductor substrate 100 to the outside so as to pass through the first insulating film 102. The plurality of first electrodes 103 may be provided after providing the first insulating film 102 on the surface 101*a* of the first substrate body 101, or the first insulating film 102 may be provided after providing a plurality of first electrodes 103 on the surface 101*a* of the first substrate body 101.

Step (b) is a step of preparing the second semiconductor substrate 200, which is a silicon substrate on which integrated circuits corresponding to a plurality of semiconductor chips 20 and including semiconductor elements and wirings for connecting these are formed. In step (b), as shown in FIG. 2A, a plurality of second electrodes 203 formed of copper, aluminum, or the like are continuously provided on a surface 201*a* of the second substrate body 201 formed of silicon or the like, and the second insulating film 202 formed of an inorganic material or an organic material is provided on the surface 201*a*. The second electrode 203 is an end surface electrode for exposing an integrated circuit and the like formed on the second semiconductor substrate 200 to the outside so as to pass through the second insulating film 202. The plurality of second electrodes 203 may be provided after providing the second insulating film 202 on the surface 201*a* of the second substrate body 201, or the second insulating film 202 may be provided after providing a plurality of second electrodes 203 on the surface 201*a* of the second substrate body 201.

The first insulating film 102 and the second insulating film 202 used in steps (a) and (b) contain an inorganic material or an organic material. An inorganic material used for the insulating film is, for example, silicon oxide ($SiO_2$). When an inorganic material such as silicon oxide is used for the insulating film, it is possible to manufacture a semiconductor device with a finer structure. When bonding the insulating films to each other in step (g), which will be described later, the bonding strength between the semiconductor substrates can increase because it is easy to strengthen the bonding between inorganic materials. Therefore, it is possible to improve the connection reliability of the semiconductor device.

Organic materials used for insulating films are, for example, polyimide, a polyimide precursor (for example, polyamic ester or polyamic acid), polyamideimide, benzocyclobutene (BCB), polybenzoxazole (PBO), and a PBO precursor. These organic materials have lower elastic moduli than, for example, inorganic materials such as silicon oxide ($SiO_2$), and are soft materials. By using such an organic material, when the insulating films are bonded to each other in step (g), which will be described later, even if there is fine debris on the insulating film, the debris is absorbed into the insulating film to prevent bonding failure due to debris. Therefore, it is possible to reliably bond the insulating films to each other. For example, when the insulating film has a thickness of 4 μm, debris with a diameter or width of 4 μm can be embedded in the organic insulating film. The elastic modulus of the organic material forming the first insulating film 102 and the second insulating film 202 may be, for example, 7.0 GPa or less, 5.0 GPa or less, 3.0 GPa or less, 2.0 GPa or less, or 1.5 GPa or less. The elastic modulus referred to herein means Young's modulus. The organic material forming the first insulating film 102 and the second insulating film 202 preferably has a thermal expansion coefficient of 70 ppm/K or less, more preferably 50 ppm/K or less.

Since the organic material used for the insulating film is liquid or soluble in a solvent, each insulating film can be easily formed as a thin film by spin coating or the like. Since these organic materials have heat resistance, the organic materials can withstand the temperature (for example, a high temperature of 300° C. or higher) when bonding the first electrodes 103 and the second electrodes 203 to each other in step (h), which will be described later. Therefore, the bonding between the insulating films is prevented from deteriorating due to high temperature. As the organic material forming the first insulating film 102 and the second insulating film 202, a photosensitive resin, a thermosetting non-conductive film (NCF), or a thermosetting resin may be used. This organic material may be an underfill material. The first insulating film 102 and the second insulating film 202 may be insulating films containing both an inorganic material and an organic material.

The second insulating film 202 may be configured to strongly adhere to the second substrate body 201. For example, the second insulating film 202 may be formed so as to have an adhesion strength at which the peeling rate in a cross-cut test for the second substrate body 201 is 1% or less. Since the second insulating film 202 strongly adheres to the second substrate body 201, it is prevented that the second insulating film 202 is wholly or partially peeled off to become debris or chip scattering arises during the cleaning in step (e), which will be described later. The "peeling rate" is the ratio of the number of pieces peeled off to the total number of pieces in the cross-cut test. The "cross-cut test" is a cross-cut test of 100 squares (interval: 1 mm, 10×10=100 squares) defined in JIS K5400. Specifically, after making 11 notches in the target test piece at intervals of 1 mm, each of which reaches the base material in the vertical and horizontal directions, a cellophane adhesive tape is attached to the target test piece. Then, after one to two minutes have passed from the attachment of the cellophane adhesive tape, the cellophane adhesive tape is instantaneously peeled off while keeping the cellophane adhesive tape perpendicular to the adhesive surface, and the number of peeled pieces is counted. The peeling rate (%) is a value obtained by dividing the number of peeled pieces by the total number of pieces (100 pieces) and multiplying it by 100.

The thickness of the second insulating film 202 may be 20 μm or less. By making the thickness of the second insulating film 202 sufficiently small, the second electrodes 203 and the wiring formed from the second electrodes 203 can be made finer. For example, the minimum size (electrode width) of each second electrode 203 formed within the second insulating film 202 is defined by the thickness of the second insulating film 202 and the aspect ratio of the photosensitive material used. When the aspect ratio of the photosensitive material is, for example, 1:1 (opening width:depth), the electrode width of each second electrode 203 can be set to 20 μm or less by setting the thickness of the second insulating film 202 to 20 μm or less. The thickness of the second insulating film 202 may be larger than 20 μm. In this case, when bonding the insulating films to each other in step (g), which will be described later, more debris can be embedded in the second insulating film 202 formed of resin. As a result, the insulating films can be more reliably bonded to each other. It is possible to improve the adhesiveness between the insulating films by reducing the stress when bonding the insulating films to each other with one of the resin insulating layers.

The thickness of the second insulating film 202 may be 4 μm or more. In this case, by embedding fine debris in the resin insulating film, it is possible to make a good connection between the first insulating film 102 and the second insulating film 202 even if fine debris remains. For example, the size of debris that can be embedded in the second insulating film 202 is defined by the thickness of the second insulating film 202 formed of resin. When the thickness of the second insulating film 202 is, for example, 4 μm, debris with a diameter or width of 4 μm can be embedded in the second insulating film 202. That is, according to this manufacturing method, even if there is debris smaller than the thickness of the second insulating film 202, the debris is embedded in the resin insulating film. Therefore, it is possible to improve the connection between the first insulating film 102 and the second insulating film 202. Similarly to the second insulating film 202, the thickness of the first insulating film 102 may be 20 μm or less, may be larger than 20 μm, or may be 4 μm or more. Debris may also be embedded in the first insulating film 102 as described above.

[Steps (c) and (d)]

Step (c) is a step of polishing the first semiconductor substrate 100. In step (c), the surface of the first insulating film 102 in which the first electrodes 103 are provided is polished by using a Chemical Mechanical Polishing (CMP) method. In step (c), for example, the first semiconductor substrate 100 may be polished by using a CMP method under the condition that the first electrodes 103 formed of copper or the like are selectively and deeply etched, or the first semiconductor substrate 100 may be polished by using a CMP method so that each surface of the first electrode 103 matches the surface of the first insulating film 102. Debris on the surface of the first semiconductor substrate 100 is also removed by this polishing.

Step (d) is a step of polishing the second semiconductor substrate 200. In step (d), the surface of the second insulating film 202 in which the second electrodes 203 are provided is polished by using a CMP method. In step (d), for example, the second semiconductor substrate 200 may be polished by using a CMP method under the condition that the second electrodes 203 formed of copper or the like are selectively and deeply etched, or the second semiconductor substrate 200 may be polished by using a CMP method so that each surface of the second electrode 203 matches the surface of the second insulating film 202. Debris on the surface of the second semiconductor substrate 200 is also removed by this polishing.

In steps (c) and (d), polishing may be performed so that the thickness of the first insulating film 102 and the thickness of the second insulating film 202 are the same. However, for example, polishing may be performed so that the thickness of the second insulating film 202 is larger than the thickness of the first insulating film 102. On the other hand, polishing may be performed so that the thickness of the second insulating film 202 is smaller than the thickness of the first insulating film 102. When the second insulating film 202 is thicker than the first insulating film 102 and is formed of an organic material, the second insulating film 202 can contain most of the debris adhering to the bonding interface during singulation into the semiconductor chips 20 or chip mounting. Therefore, it is possible to reduce bonding failure. On the other hand, when the thickness of the second insulating film 202 is smaller than the thickness of the first insulating film 102, the height of the semiconductor chip 20 to be mounted, that is, the semiconductor device 1 can be reduced.

[Step (e)]

Step (e) is a step of singulating the second semiconductor substrate 200 to obtain a plurality of semiconductor chips 20. In step (e), as shown in FIG. 3, the second semiconductor substrate 200 is arranged on a dicing tape 205 and singulated into a plurality of semiconductor chips 20 by a cutting means such as dicing from the second insulating film 202 toward the second substrate body 201. When dicing the second semiconductor substrate 200, the second insulating film 202 may be covered with a protective material or the like and then singulated. By step (e), the second insulating film 202 of the second semiconductor substrate 200 is divided into the insulating film portions 202*b* corresponding to the respective semiconductor chips 20, as shown in FIG. 2B. As a dicing method for singulating the second semiconductor substrate 200, for example, plasma dicing, stealth dicing, or laser dicing can be used. As a surface protection material for the second semiconductor substrate 200 during dicing, for example, an organic film that can be removed with water, TMAH, and the like or a thin film such as a carbon film that can be removed with plasma and the like may be provided. The bonding surface of the second semiconductor substrate 200 for bonding to the first semiconductor substrate 100 is exposed on the surface side. Thus, after dicing, plasma, an ion beam, ultraviolet rays, or an electron beam may be applied to the surface of the second insulating film 202 for surface treatment, or surface treatment may be performed by applying a coupling agent or the like to the surface of the second insulating film.

Figure 3:
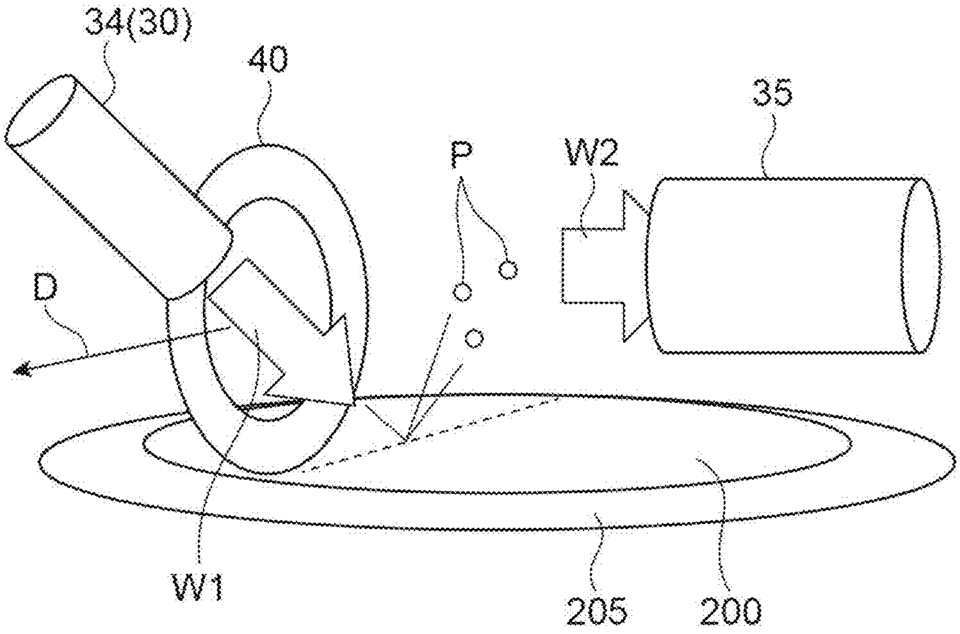
FIG. 3 is a diagram schematically showing the state of dicing and cleaning in the semiconductor device manufacturing method shown in FIGS. 2A to 2D.
Figure 4:
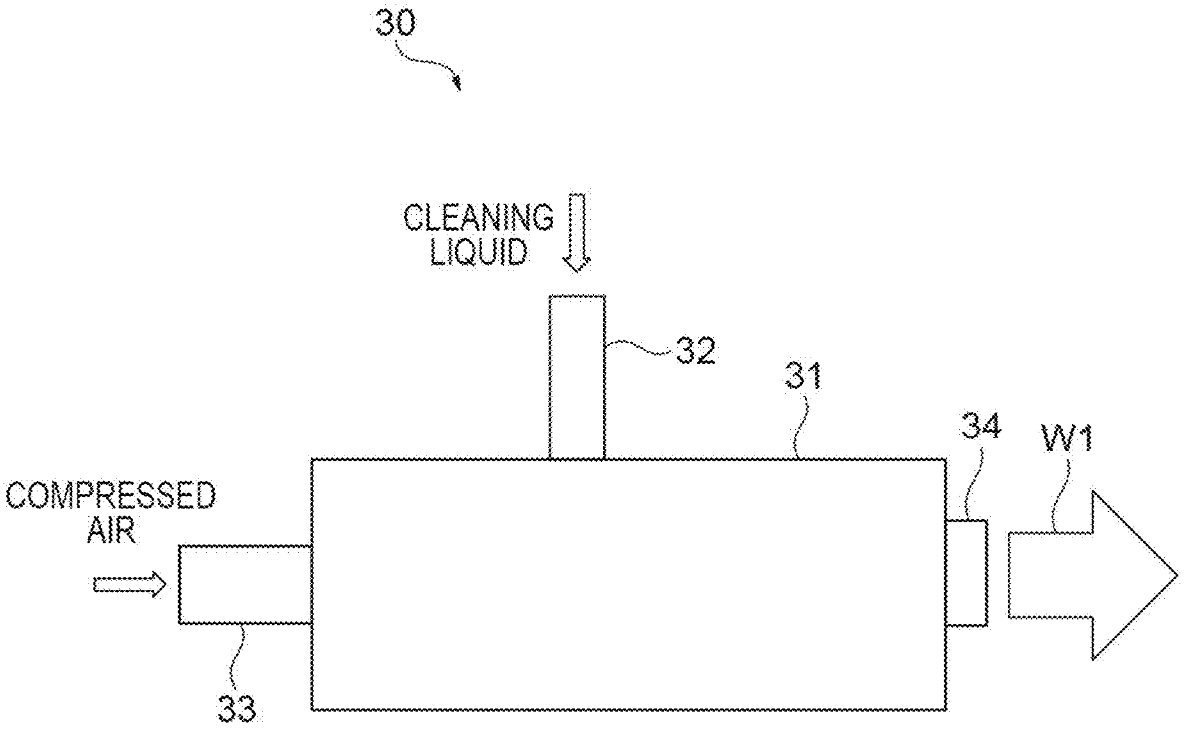
FIG. 4 is a diagram showing a cleaning device for cleaning shown in FIG. 3.

In the present embodiment, as shown in FIG. 3, the second semiconductor substrate 200 is cleaned by using a two-fluid cleaning method during the singulation in step (e). The two-fluid cleaning method is a cleaning method in which a mixed cleaning fluid in the form of a mist obtained by mixing compressed gas (for example, clean air) with liquid (for example, pure water), is used. In the two-fluid cleaning method, a higher cleaning capability can be realized by hitting the object with fine liquid at high speed. Since high-pressure cleaning water is not required, the impact on the object can be reduced. Since the impact is reduced, it is also possible to reduce a possibility that the object will be damaged to become a cause of debris. FIG. 4 is a diagram schematically showing a cleaning device for performing such two-fluid cleaning. As shown in FIG. 4, a cleaning device 30 includes a mixing unit 31, a first introduction unit 32, a second introduction unit 33, and a nozzle 34. The first introduction unit 32 introduces a cleaning liquid, such as pure water, into the mixing unit 31. The second introduction unit 33 introduces gas, such as compressed air, into the mixing unit 31. In the mixing unit 31, the cleaning liquid introduced from the first introduction unit 32 is mixed with the compressed air introduced from the second introduction unit 33 to form a mist-like mixed cleaning fluid. A mixed cleaning fluid W1 formed in the mixing unit 31 is ejected toward the second semiconductor substrate 200 (the surface of the second insulating film 202), which is being diced, through the nozzle 34 provided at the tip of the mixing unit 31, so that the second semiconductor substrate is cleaned. The cleaning device 30 further includes a mist collector 35 for collecting the cleaning liquid, which has been ejected through the nozzle 34 and with which the second semiconductor substrate 200 has been cleaned. The mist collector 35 collects a mixed cleaning fluid W2 containing debris P and the like after cleaning.

As the cleaning conditions for the cleaning device 30, pure water, which is a cleaning liquid, is introduced into the mixing unit 31 with a flow rate of 50 mL/min to 100 mL/min, and compressed air (clean air) is introduced at a pressure of 0.2 MPa to 0.4 MPa, thereby forming the mixed cleaning fluid W1. The introduction pressure of the compressed air may be, for example, 2.7 kgf/cm$^2$ to 6.0 kgf/cm$^2$ (0.26478 MPa to 0.588399 MPa). The cleaning device 30 ejects the mixed cleaning fluid W1 onto the second semiconductor substrate 200 at an ejection pressure of 10 kgf/cm$^2$ (0.9806565 MPa) or less to perform cleaning. By making the two fluids (mixed cleaning fluid W1), which are a mixture of gas and liquid, into mist-like fine droplets and making these collide with the substrate at high speed while dicing the second semiconductor substrate 200 with a dicing device 40 as shown in FIG. 3, the second semiconductor substrate 200 diced in a direction D can be efficiently cleaned without performing high-pressure cleaning. The ejection pressure of the mixed cleaning fluid used in this two-fluid cleaning method may be 8 kgf/cm$^2$ (0.784532 MPa) or less, or may be 4 kgf/cm$^2$ (0.392266 MPa) or more. The ejection pressure of the mixed cleaning fluid used in this two-fluid cleaning method may be 2 kgf/cm$^2$ (0.196133 MPa) or more. The cleaning using the mist-like mixed cleaning fluid W1 may be continued or additionally performed after the end of the dicing. After the end of the cleaning using the mist-like mixed cleaning fluid W1, the diced second semiconductor substrate 200 may be further cleaned with pure water as rinsing. After cleaning with the mixed cleaning fluid or rinsing, the diced second semiconductor substrate 200 may be dried. By such a two-fluid cleaning method, when the size of the semiconductor chip 20 is, for example, 5 mm in length and 5 mm in width, it is possible to suppress the number of pieces of debris (foreign matter) remaining on the bonding surface of each semiconductor chip 20 to 1 or less (when converted to a size of 15 mm in length and 15 mm in width) (for example, see FIG. 7B).

[Step (f)]

Figure 2C:
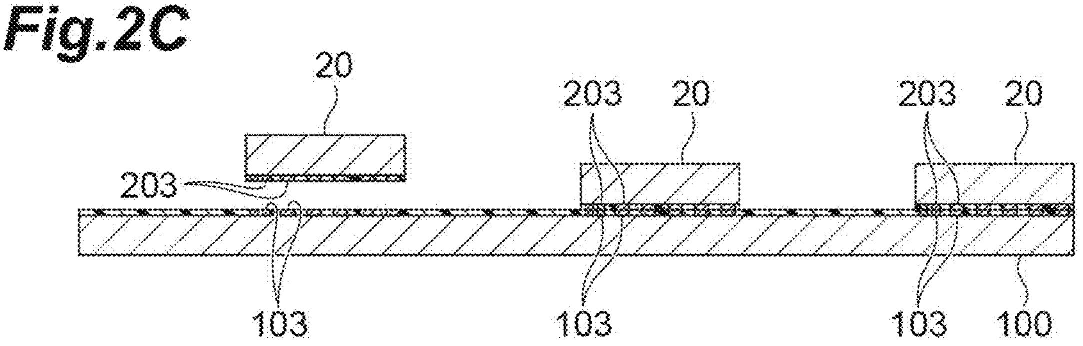
Figure 6A:
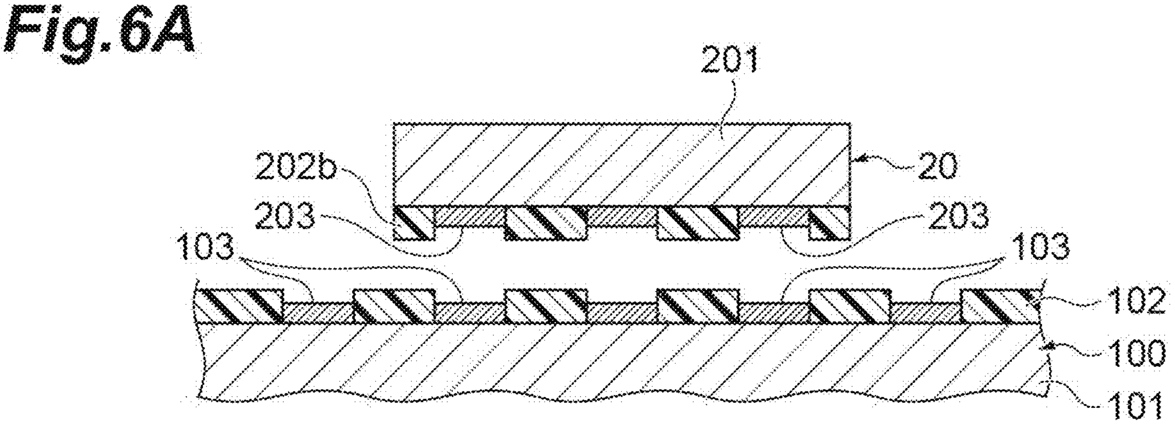
FIGS. 6A to 6D are diagrams showing in more detail a bonding method in the semiconductor device manufacturing method shown in FIGS. 2A to 2D.

Step (f) is a step of aligning each second electrode 203 of each of the plurality of semiconductor chips 20 with the first electrodes 103 of the first semiconductor substrate 100 as shown in FIG. 2C. In step (f), as shown in FIG. 6A, each semiconductor chip 20 is aligned so that the second electrode 203 of each semiconductor chip 20 faces the corresponding first electrode 103 of the first semiconductor substrate 100. For this alignment, alignment marks or the like may be provided on the first semiconductor substrate 100.

[Step (g)]

Figure 5A:
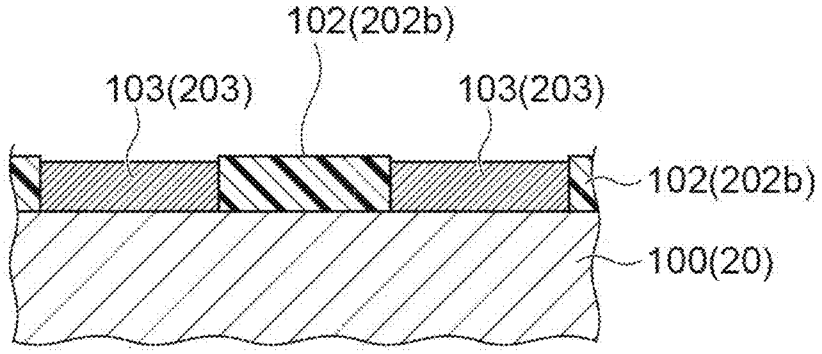
FIGS. 5A to 5C are diagrams showing in more detail a bonding method in the semiconductor device manufacturing method shown in FIGS. 2A to 2D.
Figure 5B:
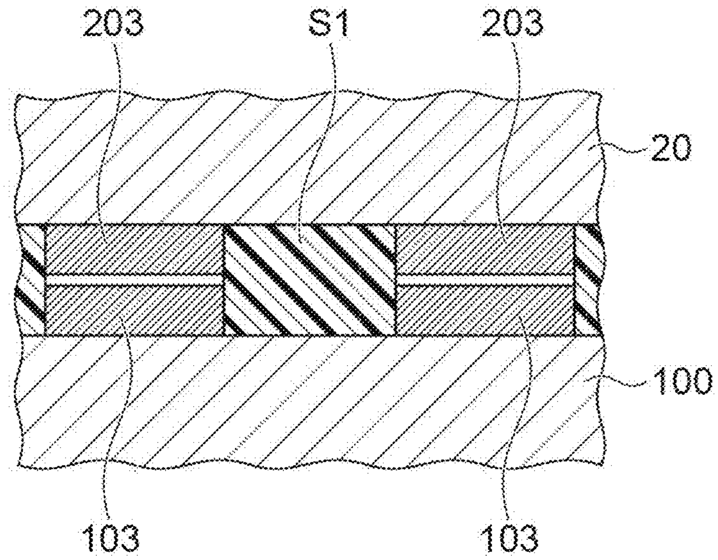

Step (g) is a step of bonding the first insulating film 102 of the first semiconductor substrate 100 and the insulating film portions **202*b* of the plurality of semiconductor chips 20 to each other. In step (g), an organic matter or metal oxide adhering to the surface of each semiconductor chip 20 is removed, and then alignment of the semiconductor chip 20 with respect to the first semiconductor substrate 100 is performed as shown in FIG. 6A. When this is completed, the insulating film portion 202*b* of each of the plurality of semiconductor chips 20 is bonded to the first insulating film 102 of the first semiconductor substrate 100 as hybrid bonding (see FIGS. 5A and 5B). At this time, the insulating film portions 202*b* of the plurality of semiconductor chips 20 and the first insulating film 102 of the first semiconductor substrate 100 may be uniformly heated and then bonded to each other. It is preferable that the temperature difference between the semiconductor chips 20 and the first semiconductor substrate 100 during bonding is, for example, 10° C. or lower. By such heating and bonding at a uniform temperature, the first insulating film 102 and the insulating film portions 202*b* are bonded to each other to form insulating bonding portions S1, so that the plurality of semiconductor chips 20 are mechanically strongly attached to the first semiconductor substrate 100. Due to heating and bonding at a uniform temperature, it is difficult for misalignment or the like to occur at the bonding portion. Therefore, it is possible to perform high-accuracy bonding. At this attachment stage, the first electrodes 103 of the first semiconductor substrate 100 and the second electrode 203 of each semiconductor chip 20 are spaced apart from each other and are not connected to each other (but aligned). The bonding of the semiconductor chips 20 to the first semiconductor substrate 100 may be performed by using other bonding methods. For example, the semiconductor chips 20 may be bonded to the first semiconductor substrate 100** by room temperature bonding.

[Step (h)]

Figure 2D:
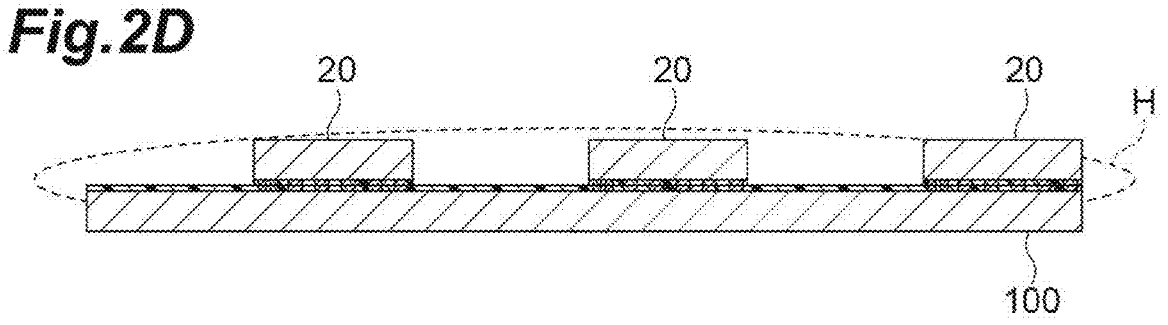
Figure 5C:
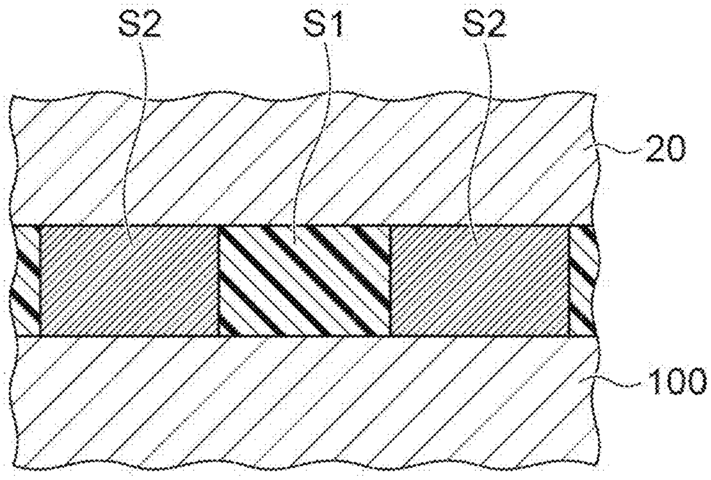
Figure 6B:
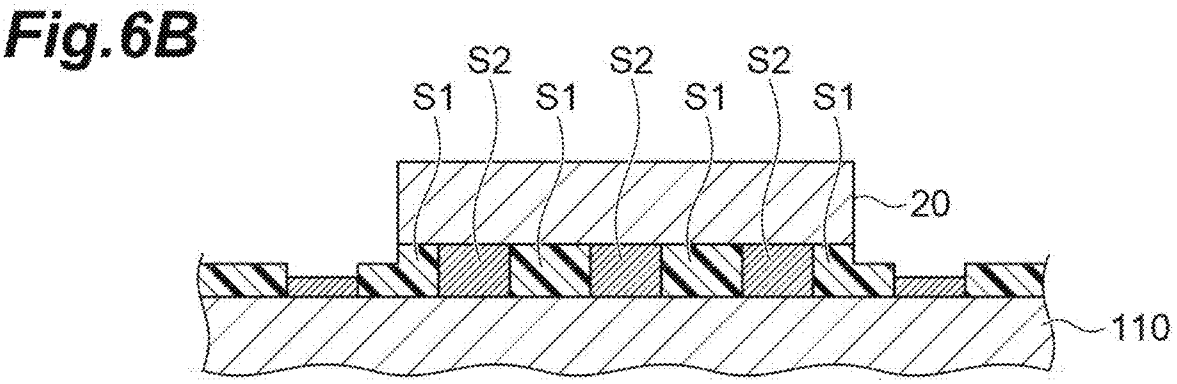
Figure 6C:
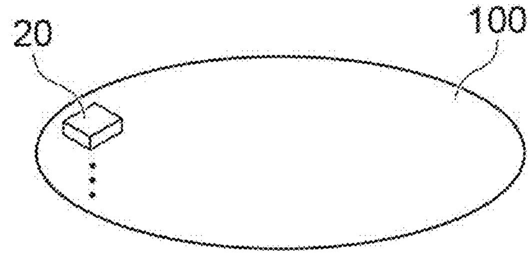
Figure 6D:
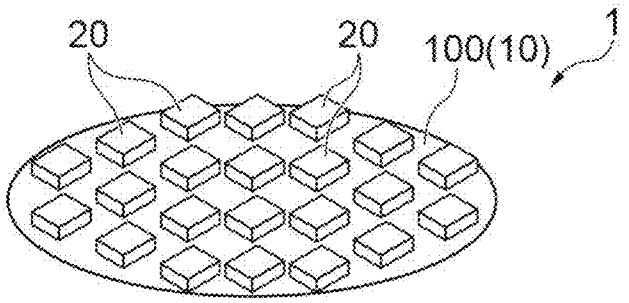

Step (h) is a step of bonding the first electrodes 103 of the first semiconductor substrate 100 and the second electrode 203 of each of the plurality of semiconductor chips 20 to each other. In step (h), as shown in FIG. 2D, when the bonding in step (g) is completed, predetermined heat H or pressure or both are applied to bond the first electrodes 103 of the first semiconductor substrate 100 and the second electrode 203 of each of the plurality of semiconductor chips 20 to each other as hybrid bonding (see also FIG. 5C). When the first electrodes 103 and the second electrodes 203 are formed of copper, the annealing temperature in step (g) is preferably 150° C. or higher and 400° C. or lower, more preferably 200° C. or higher and 300° C. or lower. By such a bonding process, the first electrodes 103 and the second electrodes 203 corresponding to the first electrodes 103 are bonded to each other to form electrode bonding portions S2, so that the first electrodes 103 and the second electrodes 203 are mechanically and electrically strongly bonded to each other. FIG. 6B shows a state in which the insulating bonding portions S1 and the electrode bonding portions S2 are formed. The electrode bonding in step (h) is performed after the bonding in step (g), but may be performed simultaneously with the bonding in step (g). Thereafter, as shown in FIGS. 6C and 6D, all the semiconductor chips 20 are bonded to the first semiconductor substrate 100 to obtain the semiconductor device 1.

As described above, it is possible to obtain the semiconductor device 1 (see FIG. 1) in which a plurality of semiconductor chips 20 are electrically and mechanically provided at predetermined positions on the first semiconductor substrate 100 with high accuracy. Thereafter, the semiconductor device (C2W) having the configuration shown in FIG. 1 may be further singulated to separately form each semiconductor device including one semiconductor chip 20 and a portion of the first semiconductor substrate 100 corresponding to the one semiconductor chip 20.

As described above, according to the semiconductor device manufacturing method according to the present embodiment, in the step of acquiring a plurality of semiconductor chips 20, the second semiconductor substrate 200 is singulated by dicing while cleaning the second semiconductor substrate 200 using the mixed cleaning fluid W1 in which the gas is introduced into the cleaning liquid. In this case, since the cleaning is performed by using the mixed cleaning fluid W1, which is mist-like by introducing the gas into the cleaning liquid, it is possible to increase the cleaning capability for fine debris while keeping the ejection pressure lower that in the case of high-pressure cleaning. Therefore, it is possible to manufacture the semiconductor device 1 by using the semiconductor chips 20 in which the debris P generated by dicing has been reliably removed from each bonding surface. As a result, it is possible to reduce connection failures of each semiconductor chip when performing three-dimensional mounting of each semiconductor chip 20.

In the manufacturing method according to the present embodiment, the adhesion strength of the second insulating film 202 with respect to the second substrate body 201 may be an adhesion strength at which the peeling rate in a cross-cut test is 1% or less. In this case, although the ejection pressure of the cleaning liquid is reduced, it is possible to suppress the occurrence of a situation in which the second insulating film 202 itself or a part thereof scatters to become debris due to the impact caused by the cleaning when cleaning the second semiconductor substrate 200. Therefore, one of the causes of debris generation when performing singulation into the semiconductor chips 20 is suppressed, and then it is possible to further reduce connection failures of the semiconductor chips.

In the manufacturing method according to the present embodiment, the thickness of each second insulating film 202 may be 20 μm or less. In this case, a thin semiconductor device can be manufactured by forming finer electrodes or circuits.

In the manufacturing method according to the present embodiment, in the step of acquiring a plurality of semiconductor chips, cleaning may be performed by ejecting the mixed cleaning fluid W1 toward the second semiconductor substrate 200 so that the ejection pressure of the mixed cleaning fluid W1 is 10 kgf/cm$^2$ (0.980655 MPa) or less. In this case, it is possible to suppress the occurrence of a situation in which the semiconductor chips 20 after dicing scatter (chip scattering) due to cleaning when dicing the second semiconductor substrate 200. It is possible to suppress the occurrence of a situation in which the second insulating film 202 is peeled off from the second semiconductor substrate 200 by the mixed cleaning fluid W1. Further, it is possible to suppress the occurrence of a situation in which the second insulating film 202 of the second semiconductor substrate 200 is scattered by the mixed cleaning fluid W1 to generate the debris P. On the other hand, cleaning may be performed by ejecting the mixed cleaning fluid W1 toward the second semiconductor substrate 200 so that the ejection pressure of the mixed cleaning fluid W1 is 2 kgf/cm$^2$ (0.196133 MPa) or more. In this case, debris can be effectively removed by the ejection pressure when dicing the second semiconductor substrate 200. As described above, it is possible to improve the manufacturing yield of semiconductor devices. In this manner, it is possible to further reduce connection failures of the semiconductor chips.

In the manufacturing method according to the present embodiment, in the step of acquiring a plurality of semiconductor chips, the mist (mixed cleaning fluid W2) after cleaning of the mixed cleaning fluid W1 ejected onto the second semiconductor substrate 200 may be collected. In this case, the mixed cleaning fluid W2 containing debris after cleaning is quickly moved away from the cleaned semiconductor chips 20 after dicing, and thus it is possible to suppress the reattachment of debris to the semiconductor chips 20. As a result, it is possible to further reduce connection failures of semiconductor chips when performing three-dimensional mounting of semiconductor chips.

In the manufacturing method according to the present embodiment, the second insulating film 202 of the second semiconductor substrate 200 may contain an inorganic material. In this case, it is possible to manufacture a semiconductor device with a finer structure. Since it is easy to strengthen the bonding between inorganic materials, the bonding strength between the semiconductor substrates can increase. Therefore, it is possible to improve the connection reliability of the semiconductor device.

In the manufacturing method according to the present embodiment, the second insulating film 202 of the second semiconductor substrate 200 may contain an organic material. In this case, due to the organic material that is a relatively soft material, debris that could not be completely removed by the cleaning described above is absorbed (embedded) in the insulating film portion formed of the organic material. Therefore, it is possible to further reduce connection failures of the semiconductor chips 20. That is, according to this manufacturing method, large debris that is difficult to embed in the insulating film portion 202*b* is removed by cleaning the second semiconductor substrate 200 using the mixed cleaning fluid, and fine debris that cannot be removed by cleaning using the mixed cleaning fluid is embedded in the insulating film formed of an organic material to become harmless. Therefore, debris of different sizes can be removed or become harmless by two complementary means. When the second insulating film 202 is formed of an organic material, the thickness of the second insulating film 202 may be 4 μm or more. In this case, by embedding fine debris in the second insulating film 202 formed of resin, the connection between the first insulating film 102 and the second insulating film 202 can be improved.

The cleaning device 30 according to the present embodiment includes the first introduction unit 32 to introduce the cleaning liquid, the second introduction unit 33 to introducing the gas, the mixing unit 31 to mix the cleaning liquid with the gas to form the mixed cleaning fluid W1, and the nozzle 34 to eject the mixed cleaning fluid W1. By using the cleaning device 30 capable of performing two-fluid cleaning, it is possible to more reliably remove debris on the bonding surfaces of the semiconductor chips after dicing.

The cleaning device 30 according to the present embodiment further includes the mist collector 35 that collects the mist (mixed cleaning fluid W2) after cleaning of the mixed cleaning fluid W1 ejected through the nozzle 34. In this case, due to the mist collector 35, the mixed cleaning fluid W2 containing debris after cleaning is quickly moved away from the cleaned semiconductor chips 20 after dicing. Therefore, it is possible to suppress the reattachment of debris to the semiconductor chips 20. As a result, it is possible to further reduce connection failures of semiconductor chips when performing three-dimensional mounting of semiconductor chips.

The cleaning method according to the present embodiment includes a step of preparing the second semiconductor substrate 200 and a step of performing cleaning when singulating the second semiconductor substrate 200. In the cleaning step, the second semiconductor substrate 200 is singulated by dicing while cleaning the second semiconductor substrate 200 using the mixed cleaning fluid W1 in which the gas is introduced into the cleaning liquid. In this case, since the cleaning is performed by using the mixed cleaning fluid W1, which is mist-like by introducing the gas into the cleaning liquid, it is possible to increase the cleaning capability for fine debris while keeping the ejection pressure lower than that in the case of high-pressure cleaning. Therefore, it is possible to manufacture the semiconductor device 1 by using the semiconductor chip 20 in which debris generated by dicing has been reliably removed. As a result, it is possible to reduce connection failures of the semiconductor chips when performing three-dimensional mounting of the semiconductor chips.

The semiconductor device 1 manufactured by the manufacturing method according to the present embodiment includes the first semiconductor substrate 100 having the first substrate body 101 and the first insulating film 102 and the first electrode 103 provided on a surface of the first substrate body 101, and a plurality of semiconductor chips 20. The first electrodes 103 of the first semiconductor substrate 100 and the second electrodes 203 of the semiconductor chips 20 are bonded to each other, and the first insulating film 102 of the first semiconductor substrate 100 and the insulating film portions 202*b* of the semiconductor chips are bonded to each other. On this insulating film portion 202*b*, there is no more than one piece of debris of 50 μm or more within a range of 15 mm in length and 15 mm in width.

EXAMPLES

Hereinafter, the present invention will be described in more detail by way of examples, but the present invention is not limited to the examples.

Example 1

In the following example, debris (foreign matter) remaining on the surfaces of the semiconductor chips was evaluated in a case where the surfaces of the semiconductor chips were cleaned by using a normal cleaning method while performing dicing (Comparative Example 1), and a case where the surfaces of the semiconductor chips were cleaned by using a two-fluid cleaning method while performing dicing (Example 1). The semiconductor chips to be cleaned were nine 5 mm-square semiconductor chips with a length of 5 mm and a width of 5 mm.

The normal cleaning method according to Comparative Example 1 was performed under the following cleaning conditions using the following cleaning device.

Cleaning device: Dicing device (DFD6302, manufactured by DISCO Inc.)

Cleaning conditions: pure water, flow rate 80 mL/min

The bonding surfaces of the semiconductor chips were cleaned while dicing the semiconductor device. Thereafter, the diced semiconductor device was rotated at a rotation speed of 800 rpm for 20 seconds to spin-clean the bonding surfaces of the semiconductor chips, and then rinsed with pure water at a flow rate of 0.8 L/min for 10 seconds. After rinsing, the diced semiconductor device was rotated at 2000 rpm for 20 seconds to be dried.

The two-fluid cleaning method according to Example 1 was performed under the following cleaning conditions using the following cleaning device.

Cleaning device: Dicing device (DFD6302, manufactured by DISCO Inc.)

Cleaning conditions: pure water, flow rate 80 ml/min

Compressed air pressure 0.3 MPa

Ejection pressure 3.05914 kgf/cm$^2$ (0.3 MPa)

After mixing the above pure water and compressed air, the bonding surfaces of the semiconductor chips were cleaned by using the mixed cleaning fluid while dicing the semiconductor device. Thereafter, the diced semiconductor device was rotated at a rotation speed of 800 rpm for 20 seconds to spin-clean the bonding surfaces of the semiconductor chips, and then rinsed with pure water at a flow rate of 0.8 L/min for 10 seconds. After rinsing, the diced semiconductor device was rotated at 2000 rpm for 20 seconds to be dried.

Figure 7A:
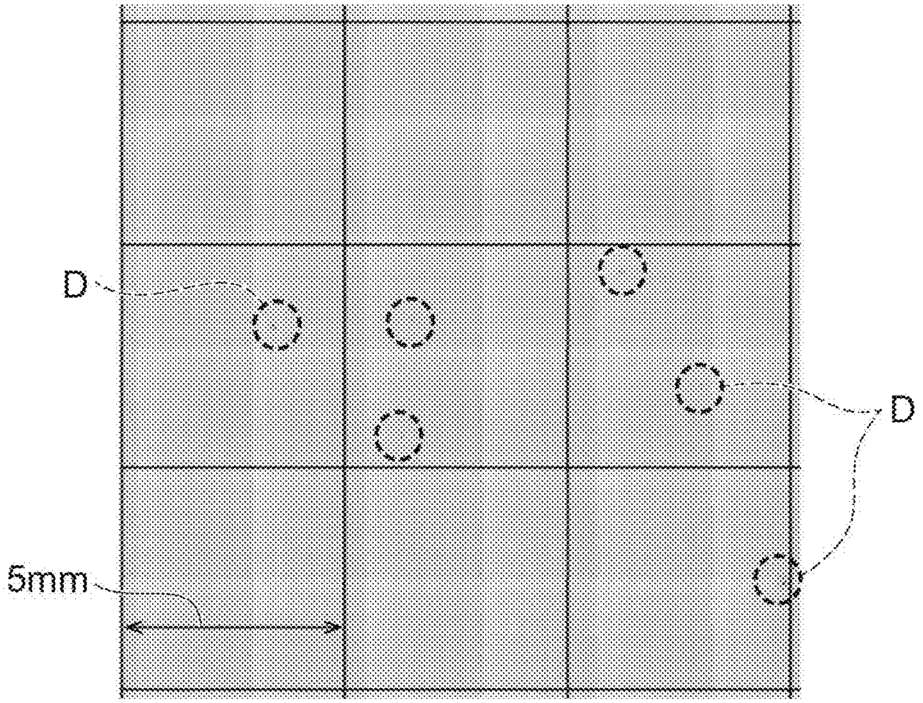
FIGS. 7A and 7B are photographs each showing debris adhering to the bonding surface of a semiconductor chip, where
Figure 7B:
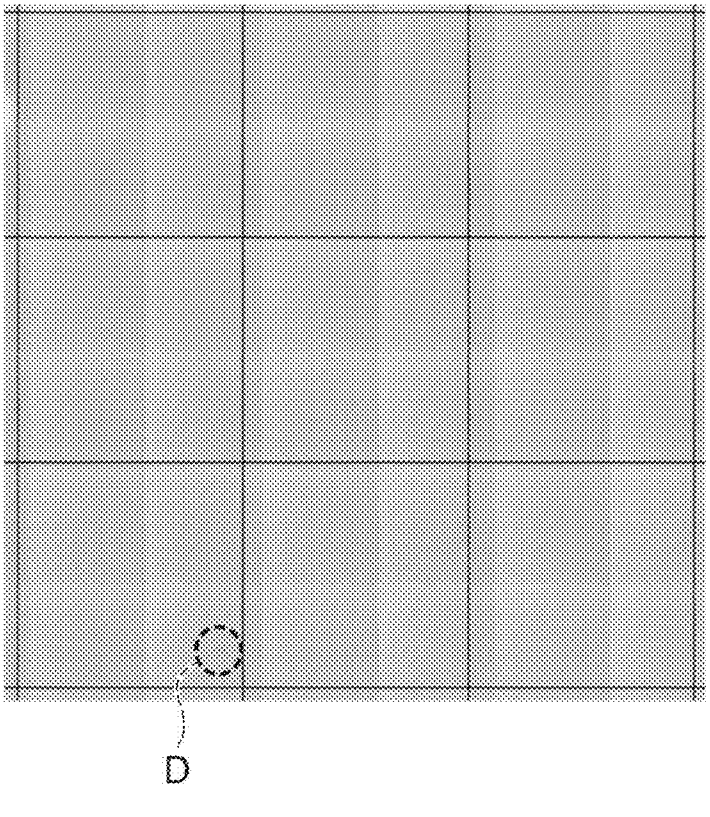

FIGS. 7A and 7B show photographs of the bonding surfaces of the semiconductor chips after cleaning. FIG. 7A shows the bonding surfaces of the semiconductor chips cleaned under the normal cleaning conditions (Comparative Example 1), and FIG. 7B shows the bonding surfaces of the semiconductor chips cleaned by using the two-fluid cleaning method according to Example 1. As shown in FIG. 7A, when two-fluid cleaning was not performed (when normal cleaning was performed), it was confirmed that two or more pieces of debris (six pieces of debris in the example of the photograph) remained in the range of 5 mm square of 5 mm in length and 5 mm in width of the semiconductor chip. On the other hand, by using the two-fluid cleaning method, the number of pieces of debris in the range of 5 mm square of 5 mm in length and 5 mm in width of the semiconductor chip was suppressed to one or less (zero for most chips). Thus, according to the manufacturing method using the two-fluid cleaning, it was confirmed that a semiconductor device could be obtained in which the number of pieces of debris of 50 μm or more in the insulating film portion of the semiconductor chip was suppressed to one or less in the range of 15 mm in length and 15 mm in width. When such a semiconductor chip is bonded to a semiconductor substrate to manufacture a semiconductor device, connection failures of the semiconductor chip can be reduced.

Example 2

Figure 8A:
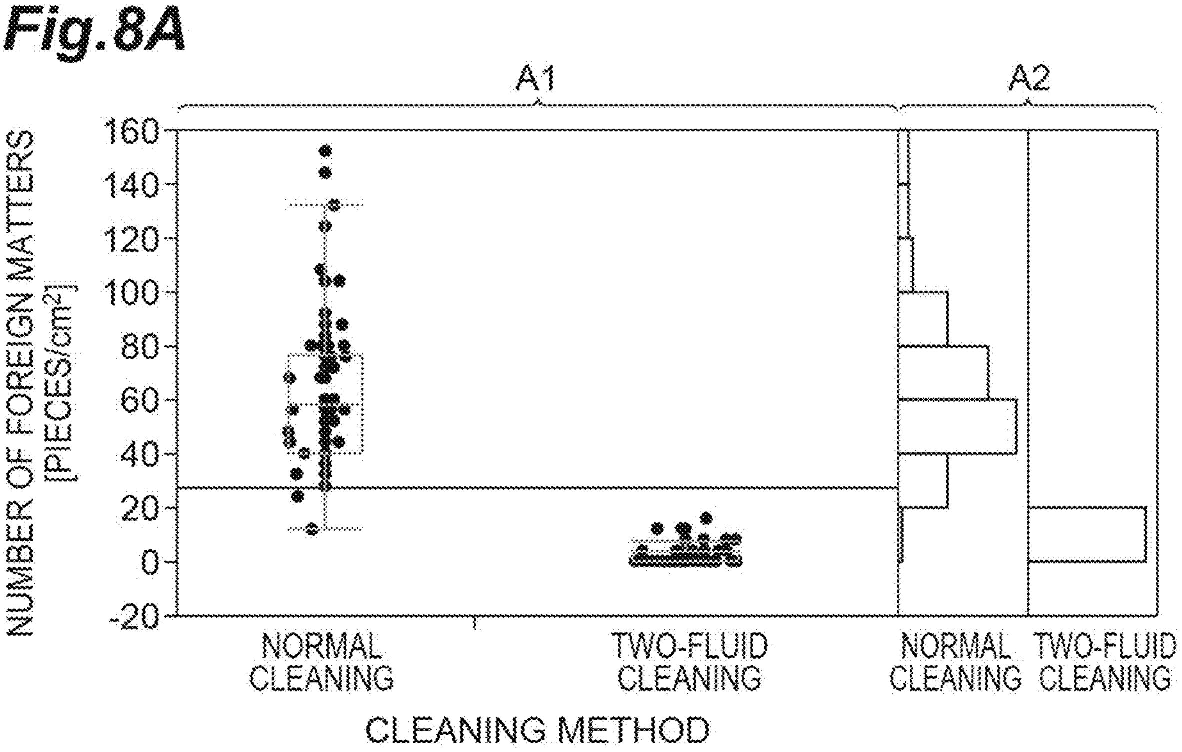
FIG. 8A is a diagram showing a comparison of the number of remaining pieces of debris between a case of cleaning a semiconductor chip using a normal cleaning method (Comparative Example 2) and a case of cleaning a semiconductor chip using a two-fluid cleaning method (Example 2)
Figure 8B:
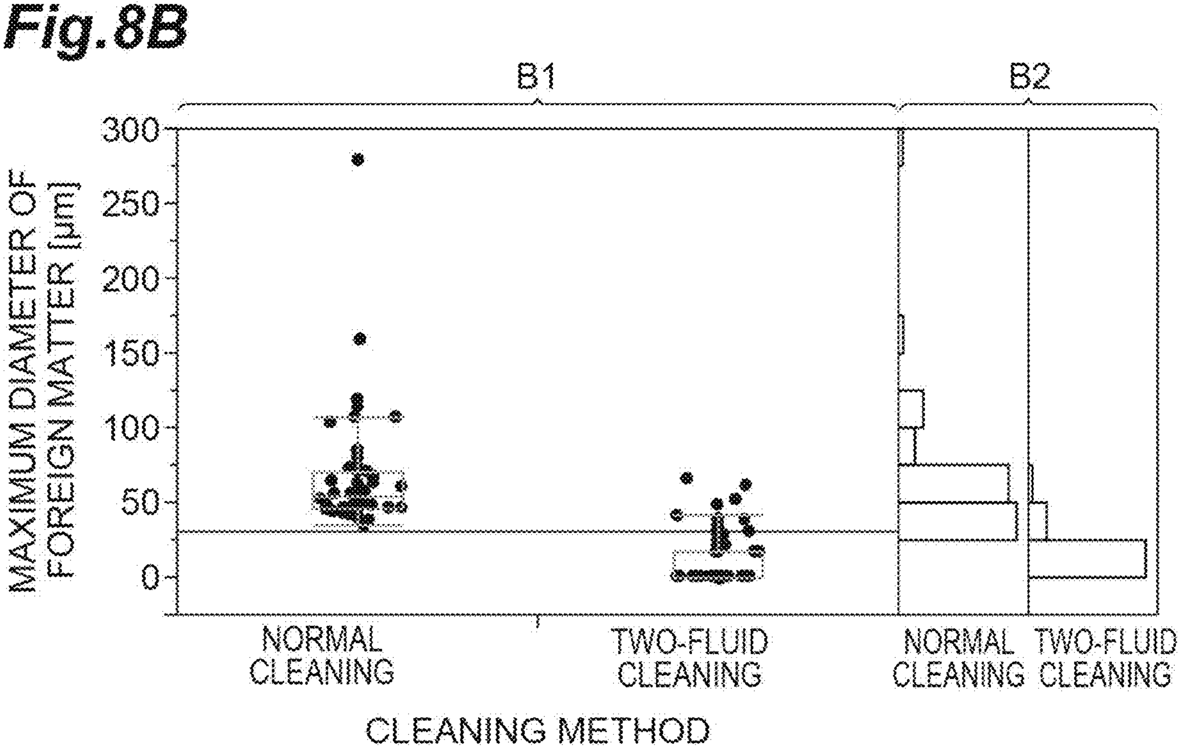
FIG. 8B is a diagram showing a comparison of the maximum diameter of remaining debris between the case of cleaning a semiconductor chip using a normal cleaning method (Comparative Example 2) and the case of cleaning a semiconductor chip using a two-fluid cleaning method (Example 2).

When the semiconductor chips were cleaned by using a normal method (the conditions were the same as in Comparative Example 1, Comparative Example 2) and when the semiconductor chips were cleaned by using a two-fluid cleaning method (the conditions were the same as in Example 1, Example 2), (a) Test A for evaluating the number of foreign matters per unit area (the number of remaining pieces of debris) and (b) Test B for evaluating the maximum diameter of remaining debris, were performed. FIG. 8A shows the results of Test A, and FIG. 8B shows the results of Test B. In FIGS. 8A and 8B, data on the left (A1 and B1) shows a table plotting each test result, and data on the right (A2 and B2) shows a table summarizing the plotted data on the left. The number of tests for Test A and Test B was 70 each.

As shown in FIG. 8A, in the case of the normal cleaning method, there was a strong tendency for the number of pieces of debris remaining on the bonding surfaces of the semiconductor chips per unit area to be 30 pieces/cm$^2$ or more. On the other hand, in the case of the two-fluid cleaning method, the number of pieces of debris per unit area was 20/cm$^2$ or less, and often 1 piece/cm$^2$ or less. As shown in FIG. 8B, in the case of the normal cleaning method, the maximum diameter of debris remaining on the bonding surfaces of the semiconductor chips was 30 μm or more. In other words, it was confirmed that debris with a large diameter remained. On the other hand, in the case of the two-fluid cleaning method, the maximum diameter of debris remaining on the bonding surface of the semiconductor chip tended to be 30 μm or less, and in many cases, the maximum diameter of the remaining debris was 10 μm or less. Thus, according to the two-fluid cleaning, it was confirmed that the number of pieces of debris remaining on the bonding surfaces of the semiconductor chips and the maximum diameter of debris could be significantly reduced compared with the conventional cleaning method.

Example 3

Figure 9A:
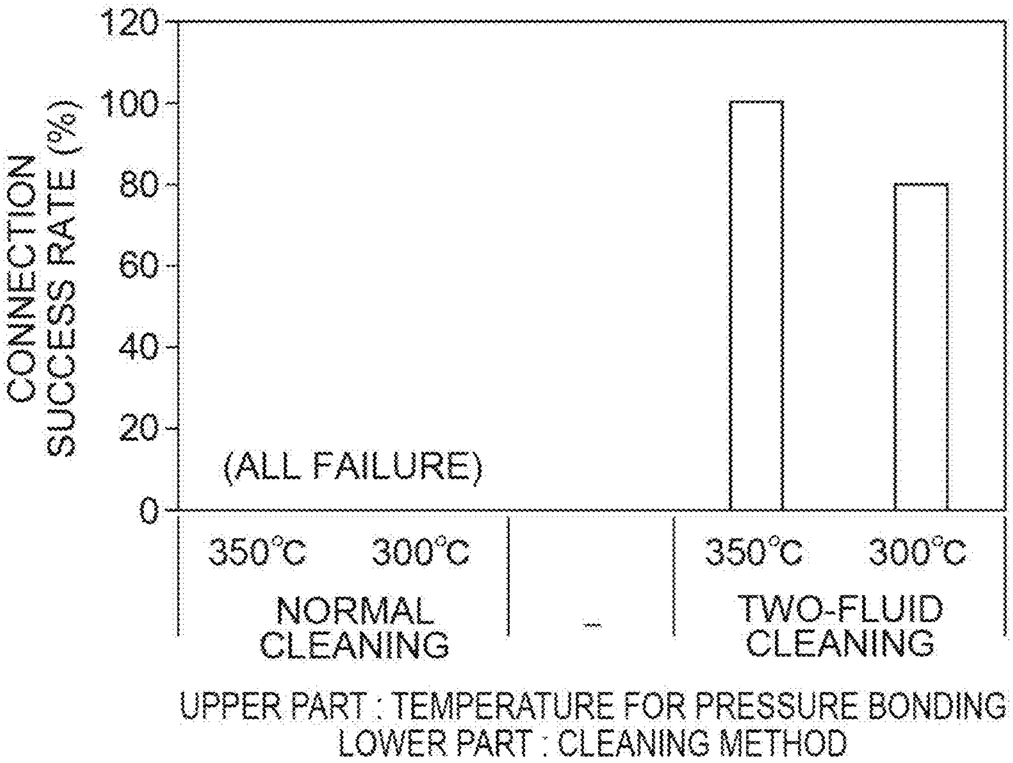
FIG. 9A is a diagram for comparison of a rate at which mechanical connection can be secured for each bonding temperature between a case of cleaning a semiconductor chip using a normal cleaning method (Comparative Example 3) and a case of cleaning a semiconductor chip using a two-fluid cleaning method (Example 3)
Figure 9B:
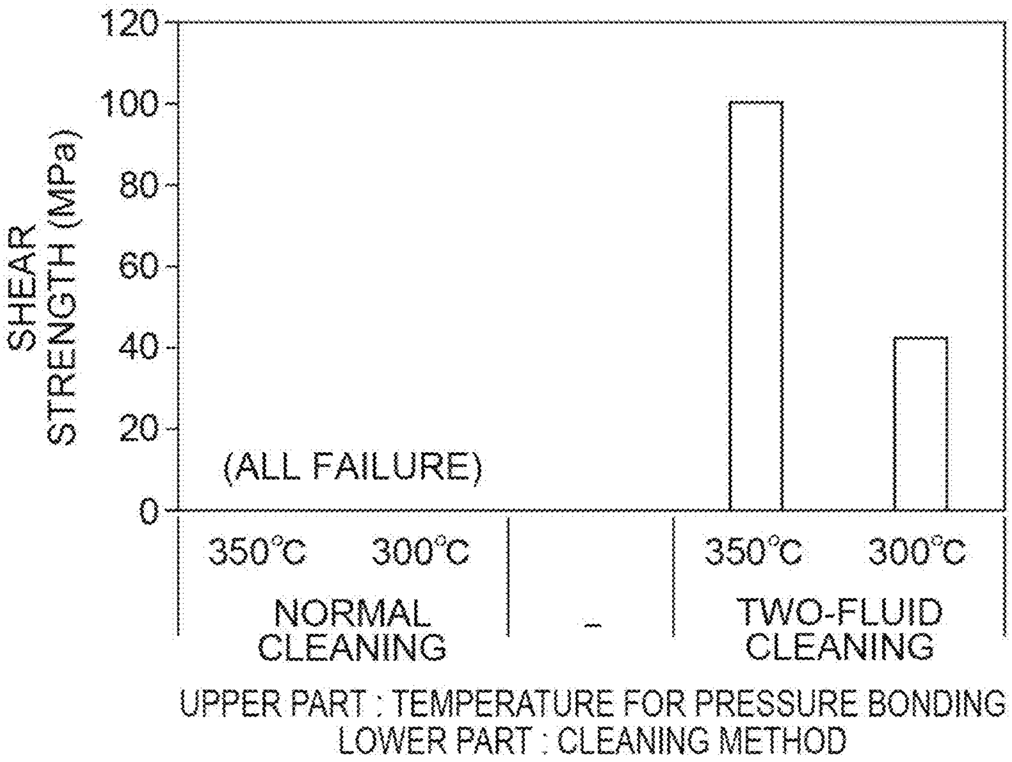
FIG. 9B is a diagram for comparison of the connection strength for each bonding temperature between the case of cleaning a semiconductor chip using a normal cleaning method (Comparative Example 3) and the case of cleaning a semiconductor chip using a two-fluid cleaning method (Example 3).

When the semiconductor chips were cleaned by using a normal method (the conditions were the same as in Comparative Example 1, Comparative Example 3) and when the semiconductor chips were cleaned by using a two-fluid cleaning method (the conditions were the same as in Example 1, Example 3), (a) Test C for evaluating the number of samples that spontaneously fell off when touched with tweezers after bonding the cleaned semiconductor chips and the semiconductor device to each other and (b) Test D for selecting samples that did not fall off spontaneously when touched with tweezers after bonding the cleaned semiconductor chips and the semiconductor device to each other and evaluating the connection strength (average value) between the semiconductor chips and the semiconductor device were performed. Two pressure bonding temperatures of 300° C. and 350° C. were used when connecting the cleaned semiconductor chips to the semiconductor device. FIG. 9A shows the results of Test C, and FIG. 9B shows the results of Test D. The number of tests for Test C and Test D was 10 each (for each pressure bonding temperature).

As shown in FIG. 9A, according to the manufacturing method using the two-fluid cleaning method according to Example 3, compared with the normal cleaning method according to Comparative Example 3, it was confirmed that a more reliable mechanical connection could be secured between the cleaned semiconductor chips and the semiconductor device. As shown in FIG. 9B, according to the manufacturing method using the two-fluid cleaning method according to Example 3, compared with the normal cleaning method according to Comparative Example 3, it was confirmed that bonding with higher shear strength was realized between the semiconductor chips and the semiconductor device.

REFERENCE SIGNS LIST

1: semiconductor device, 10: first semiconductor substrate, 20: semiconductor chip, 30: cleaning device, 31: mixing unit, 32: first introduction unit, 33: second introduction unit, 34: nozzle, 35: mist collector, 40: dicing device, 100: first semiconductor substrate, 101: first substrate body, 101*a*: surface, 102: first insulating film, 103: first electrode, 200: second semiconductor substrate, 201: second substrate body, 201*a*: surface, 202: second insulating film, 203: second electrode, 205: dicing tape.

The invention claimed is:

1. A method for manufacturing a semiconductor device, comprising:

preparing a first semiconductor substrate including a first substrate body and a first insulating film and a first electrode, the first insulating film and the first electrode being provided on a surface of the first substrate body;

preparing a second semiconductor substrate including a second substrate body and a second insulating film and a plurality of second electrodes, the second insulating film and the plurality of second electrodes being provided on a surface of the second substrate body;

polishing the second insulating film arranged on the surface side of the second semiconductor substrate;

acquiring a plurality of semiconductor chips, each of which includes an insulating film portion corresponding to the second insulating film and at least one of the second electrodes, by singulating the second semiconductor substrate;

aligning the second electrode of at least one of the plurality of semiconductor chips with the first electrode of the first semiconductor substrate;

bonding the first insulating film of the first semiconductor substrate and the insulating film portion of the semiconductor chip to each other; and bonding the first electrode of the first semiconductor substrate and the second electrode of the semiconductor chip to each other, wherein, in the acquiring of the plurality of semiconductor chips, the second semiconductor substrate is singulated by dicing while cleaning the second semiconductor substrate using a mixed cleaning fluid in which a gas is introduced into a cleaning liquid, and wherein an adhesive strength of the second insulating film with respect to the second substrate body is an adhesion strength at which a peeling rate in a cross-cut test is 1% or less.

2. The method for manufacturing a semiconductor device according to claim 1, wherein the second insulating film has a thickness of 20 μm or less.

3. The method for manufacturing a semiconductor device according to claim 1, wherein, in the acquiring of the plurality of semiconductor chips, the cleaning is performed by ejecting the mixed cleaning fluid toward the second semiconductor substrate so that an ejection pressure of the mixed cleaning fluid is 0.980665 MPa or less.

4. The method for manufacturing a semiconductor device according to claim 1, wherein, in the acquiring of the plurality of semiconductor chips, the cleaning is performed by ejecting the mixed cleaning fluid toward the second semiconductor substrate so that an ejection pressure of the mixed cleaning fluid is 0.196133 MPa or more.

5. The method for manufacturing a semiconductor device according to claim 1, wherein, in the acquiring of the plurality of semiconductor chips, mist after cleaning of the mixed cleaning fluid ejected onto the second semiconductor substrate is collected.

6. The method for manufacturing a semiconductor device according to claim 1, wherein, in the acquiring of the plurality of semiconductor chips, the mixed cleaning fluid is ejected onto the second insulating film of the second semiconductor substrate, and dicing is performed from the second insulating film toward the second substrate body.

7. The method for manufacturing a semiconductor device according to claim 1, wherein the second insulating film of the second semiconductor substrate contains an inorganic material.

8. The method for manufacturing a semiconductor device according to claim 1, wherein the second insulating film of the second semiconductor substrate contains an organic material.

9. The method for manufacturing a semiconductor device according to claim 8, wherein the second insulating film has a thickness of 4 μm or more.

10. The method for manufacturing a semiconductor device according to claim 8, wherein the organic material contained in the second insulating film contains polyimide, a polyimide precursor, polyamideimide, benzocyclobutene (BCB), polybenzoxazole (PBO), or a PBO precursor.

11. A cleaning device used in the method for manufacturing a semiconductor device according to claim 1, comprising:

a first introduction unit configured to introduce the cleaning liquid;

a second introduction unit configured to introduce the gas;

a mixing unit configured to mix the gas with the cleaning liquid to form the mixed cleaning fluid; and a nozzle that ejects the mixed cleaning fluid, wherein the nozzle is configured to eject the mixed cleaning fluid so that an ejection pressure of the mixed cleaning fluid is 0.980665 MPa or less.

12. The cleaning device according to claim 11, further comprising:

a mist collector that collects mist after cleaning of the mixed cleaning fluid ejected through the nozzle.

13. A cleaning method, comprising:

preparing a semiconductor substrate including a substrate body and an insulating film and a plurality of electrodes, the insulating film and the plurality of electrodes being provided on a surface of the substrate body; and cleaning when singulating the semiconductor substrate, wherein, in the cleaning, the semiconductor substrate is singulated by dicing while cleaning the semiconductor substrate using a mixed cleaning fluid in which a gas is introduced into a cleaning liquid, and wherein, in the cleaning, the cleaning is performed by ejecting the mixed cleaning fluid toward the semiconductor substrate so that an ejection pressure of the mixed cleaning fluid is 0.980665 MPa or less.

14. The cleaning method according to claim 13, wherein, in the cleaning, the cleaning is performed by ejecting the mixed cleaning fluid toward the semiconductor substrate so that an ejection pressure of the mixed cleaning fluid is 0.196133 MPa or more, wherein, the insulating film of the semiconductor substrate to be cleaned contains an organic material, and the insulating film has a thickness of 4 μm or more.

15. A semiconductor device, comprising:

a first semiconductor substrate including a first substrate body and a first insulating film and a first electrode, the first insulating film and the first electrode being provided on a surface of the first substrate body; and a second semiconductor substrate including a second substrate body and a second insulating film and a second electrode, the second insulating film and the second electrode being provided on one surface of the second substrate body, wherein the first electrode of the first semiconductor substrate and the second electrode of the second semiconductor substrate are bonded to each other, and the first insulating film of the first semiconductor substrate and the second insulating film of the second semiconductor substrate are bonded to each other, and wherein there is no more than one piece of debris of 50 μm or more within a range of 15 mm in length and 15 mm in width on the second insulating film.

16. A method for manufacturing a semiconductor device, comprising:

preparing a first semiconductor substrate including a first substrate body and a first insulating film and a first electrode, the first insulating film and the first electrode being provided on a surface of the first substrate body;

preparing a second semiconductor substrate including a second substrate body and a second insulating film and a plurality of second electrodes, the second insulating film and the plurality of second electrodes being provided on a surface of the second substrate body;

polishing the second insulating film arranged on the surface side of the second semiconductor substrate;

acquiring a plurality of semiconductor chips, each of which includes an insulating film portion corresponding to the second insulating film and at least one of the second electrodes, by singulating the second semiconductor substrate;

aligning the second electrode of at least one of the plurality of semiconductor chips with the first electrode of the first semiconductor substrate;

bonding the first insulating film of the first semiconductor substrate and the insulating film portion of the semiconductor chip to each other; and bonding the first electrode of the first semiconductor substrate and the second electrode of the semiconductor chip to each other, wherein, in the acquiring of the plurality of semiconductor chips, the second semiconductor substrate is singulated by dicing while cleaning the second semiconductor substrate using a mixed cleaning fluid in which a gas is introduced into a cleaning liquid, and wherein, in the acquiring of the plurality of semiconductor chips, the cleaning is performed by ejecting the mixed cleaning fluid toward the second semiconductor substrate so that an ejection pressure of the mixed cleaning fluid is 0.980665 MPa or less.

17. A method for manufacturing a semiconductor device, comprising:

preparing a first semiconductor substrate including a first substrate body and a first insulating film and a first electrode, the first insulating film and the first electrode being provided on a surface of the first substrate body;

preparing a second semiconductor substrate including a second substrate body and a second insulating film and a plurality of second electrodes, the second insulating film and the plurality of second electrodes being provided on a surface of the second substrate body;

polishing the second insulating film arranged on the surface side of the second semiconductor substrate;

acquiring a plurality of semiconductor chips, each of which includes an insulating film portion corresponding to the second insulating film and at least one of the second electrodes, by singulating the second semiconductor substrate;

aligning the second electrode of at least one of the plurality of semiconductor chips with the first electrode of the first semiconductor substrate;

bonding the first insulating film of the first semiconductor substrate and the insulating film portion of the semiconductor chip to each other; and bonding the first electrode of the first semiconductor substrate and the second electrode of the semiconductor chip to each other, wherein, in the acquiring of the plurality of semiconductor chips, the second semiconductor substrate is singulated by dicing while cleaning the second semiconductor substrate using a mixed cleaning fluid in which a gas is introduced into a cleaning liquid, and wherein, in the acquiring of the plurality of semiconductor chips, the cleaning is performed by ejecting the mixed cleaning fluid toward the second semiconductor substrate so that an ejection pressure of the mixed cleaning fluid is 0.196133 MPa or more.

18. A method for manufacturing a semiconductor device, comprising:

preparing a first semiconductor substrate including a first substrate body and a first insulating film and a first electrode, the first insulating film and the first electrode being provided on a surface of the first substrate body;

preparing a second semiconductor substrate including a second substrate body and a second insulating film and a plurality of second electrodes, the second insulating film and the plurality of second electrodes being provided on a surface of the second substrate body;

polishing the second insulating film arranged on the surface side of the second semiconductor substrate;

acquiring a plurality of semiconductor chips, each of which includes an insulating film portion corresponding to the second insulating film and at least one of the second electrodes, by singulating the second semiconductor substrate;

aligning the second electrode of at least one of the plurality of semiconductor chips with the first electrode of the first semiconductor substrate;

bonding the first insulating film of the first semiconductor substrate and the insulating film portion of the semiconductor chip to each other; and bonding the first electrode of the first semiconductor substrate and the second electrode of the semiconductor chip to each other, wherein, in the acquiring of the plurality of semiconductor chips, the second semiconductor substrate is singulated by dicing while cleaning the second semiconductor substrate using a mixed cleaning fluid in which a gas is introduced into a cleaning liquid, wherein the second insulating film of the second semiconductor substrate contains an organic material, and wherein the organic material contained in the second insulating film contains polyimide, a polyimide precursor, polyamideimide, benzocyclobutene (BCB), polybenzoxazole (PBO), or a PBO precursor.

* * * * *